PHOTOSENSITIVE MASKING FOR CHEMICAL ETCHING
Filed March 4, 1963
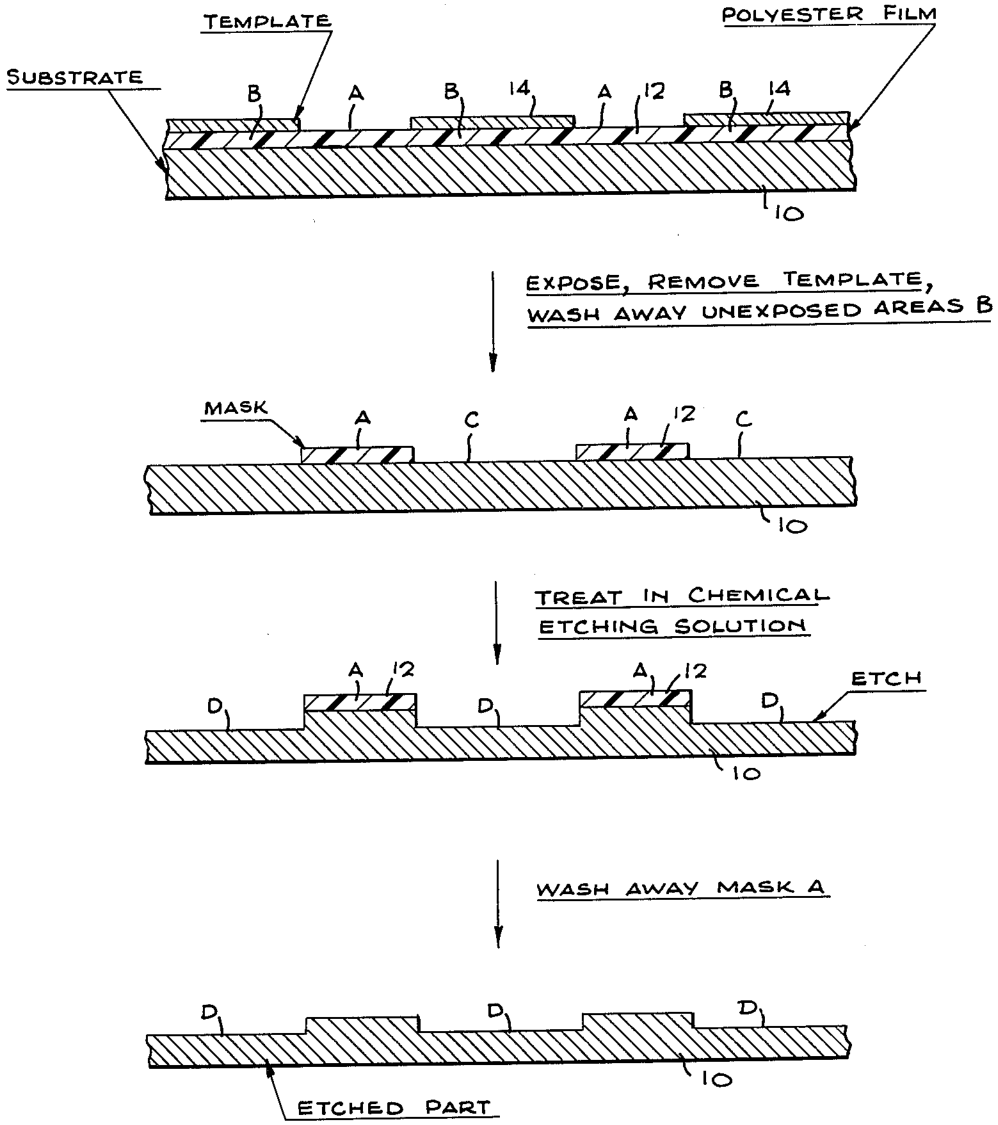
WESLEY T. BAILEY
INVENTOR.
BY Philip Sutkow
Max Geldin
ATTORNEYS

United States Patent Office 3,255,006
Patented June 7, 1966

3,255,006
PHOTOSENSITIVE MASKING FOR CHEMICAL ETCHING

Wesley T. Bailey, Palos Verdes Estates, Calif., assignor to Purex Corporation, Ltd., Lakewood, Calif., a corporation of California Filed Mar. 4, 1963, Ser. No. 262,425
25 Claims. (Cl. 96—36)

This invention relates to chemically resistant photosensitive or photopolymeric resin compositions especially adapted for use as maskants for chemical etching, that is, production of structural or ornamental parts by etching areas of the parts not protected by the maskant. The invention is especially concerned with the provision of chemically resistant photosensitive maskant compositions particularly designed for application to metal and plastic parts, and to the procedure for applying such maskant compositions to the surfaces of such parts to form a maskant coating, removing selected portions of the maskant to provide a desired unprotected area to be etched, chemically etching such unprotected area, and removing the mask.

In the technique of chemical etching, e.g. in the production of a relatively deep etch, employing alkaline or acid etching solutions, it is particularly important that the maskant employed to protect certain areas of the part to be etched be chemically resistant to such corrosive solutions in order to obtain etched configurations having sharp line definition, with a minimum amount of undercutting of the part surface adjacent the mask edges. It is also important that the mask have good adheseion to the substrate especially during the etching operation to prevent ingress of etching solution between the mask and substrate, and to avoid any etching or pitting of the area of the part beneath the mask which it is desired to protect against the action of the etching bath. A further criterion of a good maskant material is that it can be readily removed or stripped from the part surface following the etching operation.

It is accordingly one object of the invention to provide a maskant composition which can be applied readily to a part surface and having the above noted characteristics, that is, good chemical resistance, good adherence to the substrate, particularly to aluminum and steel parts, and which is readily strippable, e.g. by treatment with water or other liquids.

After applying a maskant coating to a part surface, a design is formed in the coating, and selected portions of the maskant are removed to leave a bare surface having a design or configuration corresponding to the etch pattern to be formed in such surface. One method of accomplishing this is to scribe the pattern in the maskant covering the part surface with a sharp instrument, and then to strip the portion of the mask within the scribed area from the part surface, so that only those portions of the part surface not covered by the mask are subjected to chemical etching.

While this procedure may be satisfactory when the etch pattern desired is of simple geometric shape, where it is desired to etch a complicated or irregular etch pattern into the surface of a part, the aforementioned method is often unsatisfactory. It is known in the art to produce printing plates employing a resist containing a light sensitive bichromate or silver salt, by exposing the resist to light, dissolving the unexposed portions of the resist to form a bare metal surface corresponding to the desired etch pattern, leaving the exposed portions of the resist as mask, and treating the plate in an etching bath. However, during the etching period the bichromate or silver remaining in the unexposed portion of the resist tends to be carried out of the colloid layer and into the bath, causing a deterioration of the bath and a reduced tank life of the etchant. Further, bichromates thus washed into the etch solution, e.g. an alkaline etch solution, will tend undesirably to oxidize the exposed metal surface of the treated parts, to form a resistant oxide film thereon.

Other more sophisticated light sensitive maskant compositions have recently been developed. However, such compositions are highly sensitive to light and require darkroom conditions during application of the maskant composition to the part and during subsequent handling and exposure of the coated substrate. Further, such compositions require extreme care and unusual room conditions, particularly during application of such maskant compositions to the substrate in order to obtain coatings which are free of pinholes. Thus, such compositions are recommended for use under so-called "white room" conditions, that is, lint-free air, lint-free protective clothing for operators, and no rapid change of air providing draft or wind conditions. Such prior art compositions also tend to be brittle so that flexing of the substrate surface on which such compositions are coated tends to produce loss of adhesion of the coating to the part. Although plasticizers are recommended for use to aid in flexibilizing such compositions, plasticization thereof often tends to result in reduced resistance of such coatings to chemical etchants. Further, such maskant compositions are relatively expensive for production of a maskant coating of a given thickness.

It is therefore another object of the invention to provide highly chemically resistant photopolymeric maskant compositions for chemical etching, particularly on metals, e.g. aluminum and steel, and to provide procedure for applying such compositions to a metal part to be etched to form a mask, etching said part, and removing said mask, said maskant compositions having one or more of the following characteristics: namely, a maskant composition which can be applied easily in liquid form to a part surface to provide a uniform adherent maskant coating that can be readily dried; which has a light sensitive system permitting rapid polymerization of the light exposed areas of the coated surface during exposure thereof to actinic light, e.g. ultra-violet light, but lacks sensitivity to interior daylight and ordinary artificial lights; which can be applied to the substrate under normal room conditions, that is, in the absence of lint-free air and carefully controlled air conditions, etc., without pinholing; which is flexible; which has low sensitivity to heat, that is, does not polymerize to any substantial extent on exposure to the heat generated by ultraviolet or actinic light sources employed to photopolymerize the resin, at the temperatures of such light sources, but when can be post cured by heat following light exposure; which is highly resistant to chemical etching baths, and which does not contaminate the etch bath by dissolution therein of any of the components of the maskant composition; which remains uniformly adherent to the part surface, especially during etching; which is readily removable or strippable from the part following the etching operation; and which is less expensive than the above noted recently developed maskant compositions.

A further object is the provision of highly chemically resistant photopolymeric maskant compositions, preferably having the above desirable characteristics, and containing compatible photosensitizers (or photoinitiators) and accelerators to increase the rapidity and extent of photopolymerization.

Yet another object is the provision of highly chemically resistant photopolymeric resins containing compatible photoinitiators and accelerators, such accelerators and initiators being chosen particularly with respect to their light absorbing and emitting wave lengths, such that they cooperate to enhance the rate and extent of cure of the resin during light exposure.

A still further object is the provision of photopolymeric compositions as noted above, and including materials which function as indicators to permit inspection of the surface of the substrate following removal of the unexposed portions of the photopolymeric mask, to insure substantially complete removal of such unexposed maskant portions, and also to permit inspection of the surface of the exposed mask portions.

Yet another object is the provision of procedure for applying the above maskant compositions to a part to be etched, forming a pattern in such maskant corresponding to the desired portion of the surface to be etched, etching the part and removing the remaining maskant.

Other objects and advantages of the invention will appear hereinafter.

I have discovered that certain polyesters, particularly those referred to herein as "unsaturated polyesters," and possessing a high degree of chemical resistance to chemical etching compositions, are unexpectedly well adapted for use as photopolymerizable masks in chemical etching operations, particularly on metals such as aluminum and steel. According to the invention, a film of the polyester is applied to the surface of the part to be chemically etched, a negative or template is placed over the film so applied, and the part is exposed to actinic light, e.g. ultraviolet light, causing photopolymerization of the exposed areas of the polyester film. The unexposed areas of the polyester film are then washed or dissolved away to leave a positive image or mask corresponding to the exposed light polymerized areas of the polyester film. With or without further curing of the remaining exposed film, the part so masked is treated with a chemical etching solution to etch away the exposed or bare surface portions of the part not protected by the mask, such chemical treatment taking place for a period sufficient to form the desired depth of etch in the part. The part is then treated to permit removal of the mask from the part e.g. by stripping, providing a part having an etch configuration corresponding to the pattern of the template or negative through which the polyester film was exposed.

As an example of a particularly suitable unsaturated polyester according to the invention, is the polyester film formed from a composition composed of isophthalic acid, maleic anhydride (or fumaric acid), and propylene glycol. Compositions of this type can be esterified to produce relatively low acid number, high viscosity resins which can be dissolved with, for example, a vinyl monomer such as styrene, to form a liquid having good uniform film-forming properties, and most or all of the other desirable characteristics noted above, including good adherence to the substrate, particularly aluminum and steel, together with the unexpected advantageous properties of producing images following exposure, having good line definition along the edges of the mask corresponding to the borders of the image, lack of sensitivity to ordinary interior light from windows and to ordinary artificial lights, freedom from "pinholing," insensitivity to heat from the exposing light source, chemical resistance and ease of removal after chemical etching.

The term "unsaturated polyesters" employed herein and referring to the preferred resins, is intended to include polyesters produced by the esterification of an ethylenically unsaturated polycarboxylic, preferably dicarboxylic, aliphatic aicd, or their anhydrides, with a polyhydroxy organic compound, e.g. a polyhydric alcohol, preferably a dihydric alcohol. Examples of unsaturated dicarboxylic acids and anhydrides thereof which can be employed include the aliphatic unsaturated dibasic acids and their anhydrides including maleic acid and its anhydride, fumaric acid, methyl fumaric acid, itaconic acid, citraconic acid, and the like. Also, unsaturated tricarboxylic acids such as aconitic acid may be employed. The above aliphatic unsaturated polybasic acids can be employed separately, or in combination with aromatic dicarboxylic acids and their anhydrides, such as isophthalic acid, phthalic acid and its anhydride, tetrahydronaphthalic acid and its anhydride, 1,2 napthalene dicarboxylic acid and its anhydride. A particularly useful exemplary combination is maleic anhydride or fumaric acid together with isophthalic acid. If desired, the polyester resin can be modified by use of a polybasic aliphatic acid which does not contain polymerizable olefinic groups. Thus, saturated polybasic acids, such as saturated aliphatic dibasic acids, can be used in combination with the ethylenically unsaturated polycarboxylic acids described above, for modifying the polymer, e.g. to impart flexibility thereto. Examples of such saturated polybasic acids include, adipic, suberic and azelaic acids.

The polyhydroxy organic compound employed for esterification of the above unsaturated aliphatic acids can include both aromatic and aliphatic polyhydroxy compounds, the latter being preferred. Thus, for example, I may employ bisphenol-A and its derivatives, and other dihydroxy phenols. Preferably, I employ the glycols, including the diglycols and triglycols, such as the alkylene glycols, e.g. ethylene glycol and propylene glycol, and the polyalkylene glycols such as diethylene glycol, triethylene glycol, tetraethylene glycol, dipropylene glycol, and the like.

The proportions of polybasic aliphatic unsaturated acid, polybasic aromatic acid, and saturated polybasic acid, when used, in relation to the polyhydroxy compound, are chosen to obtain the desired hardness, flexibility and chemical resistance characteristics of the polymerized polyester. Harder resins are obtained by increasing the proportion of aromatic dicarboxylic acid, and harder more chemically resistant resins are obtained by increasing the proportion of unsaturated polybasic acid, to saturated acid, whereas softer, more flexible resins are obtained employing a relatively large proportion of such saturated acid to unsaturated and aromatic acids.

The amount of resin, e.g. polyester, present in the resin formulations of the invention can range from about 5 to about 80%, generally about 25 to about 60% by weight of the resin formulation, and generally such polyester constitutes a substantial or major portion of this formulation.

It has been found that the addition of other resins, particularly cellulose acetate-butyrate, to the polyester resin, modifies the film forming characteristics of the resin formulation and improves the flexibility and toughness of the cured resin film. The addition of such butyrate tends to plasticize or soften the cured film so as to ensure the prevention of pinholes in the applied maskant coating, and also facilitates stripping of the cured film following etching. The amount of such material employed may vary, but may generally range from about 2 to about 6% by weight of the resin formulation.

The polyester resin composition which is applied to the substrate to be masked according to the invention, can be prepared by adding the polybasic acid or acids and polyhydroxy compound together, and heating at temperature and for a time sufficient to obtain a polyester resin composition of the desired viscosity and acid number. Where a three component composition is employed for preparation of the resin, e.g. a mixture of isophthalic acid, maleic anhydride and propylene glycol, the isophthalic acid preferably is esterified first with the glycol, and then the maleic anhydride is added to carry the esterification reaction to completion. The polyester compositions employed according to the invention are essentially thermosetting materials.

The polyester resin so formed is dissolved with a vinyl monomer. By the term "vinyl monomer" is meant a monomer containing the vinyl radical, including, for example, styrene, vinyl toluene, vinyl acetate, diallyl phthalate, diallyl isophthalate, acrylic and methacrylic esters, or mixtures thereof. The resin formulation including the vinyl monomer is usually in the form of a liquid. Triallyl cyanurate monomer alternatively can be added to the polyester resin, the resulting mixture however, being in solid, rather than in liquid form. The amount of vinyl monomer employed can range from about 10% to about 150% by weight of resin solids.

It has been found that the incorporation of diallyl phthalate, together with cellulose acetate-butyrate, each preferably, although not necessarily, in a proportion of about 2 to about 6% by weight of the resin formulations, improves the flexibility, toughness and film forming characteristics of the polyester resin formulations hereof, and also the surface wetting characteristics of the polyester maskant without increasing its tackiness in the pre-gel state, that is, prior to photopolymerization of the resin by exposure to actinic light. Under these conditions, an additional amount of a vinyl monomer other than diallyl phthalate, e.g. styrene, is incorporated in the resin formulation to provide a total amount of vinyl monomer within the aforementioned 10 to 150% range.

Although not preferred, another class of photopolymeric resins which may be employed according to the invention are the thermosetting acrylic resins. These include, for example, polyacrylates such as those obtained from alkyl methacrylates, e.g. methyl methacrylate, and the alkenyl methacrylates, e.g. crotyl methacrylate. However, for suitability according to the invention, such acrylic resins preferably are chosen which have good strippability from the part.

A polymerization inhibitor can be incorporated into the mixed polymeric composition prior to use to prevent premature polymerization of the resin before it is applied to a part surface according to the invention. Any suitable polymerization inhibitor can be used for this purpose, such as copper naphthenate or hydroquinone for the preferred polyester resin formulations, the amount of such inhibitor used being less than about 1%, e.g. of the order of about 0.1%, based on the weight of the resin formulation.

For best results, a suitable solvent is incorporated in the resin formulation described above. Suitable preferred solvents for this purpose are the polar solvents having relatively high volatility, preferably ketones. Examples of ketones which have been found particularly satisfactory are acetone, methyl ethyl ketone and methyl isobutyl ketone. Also, 2-nitropropane has been found to be useful. Such solvents, when added to the resin formulation, improve the flow characteristics of the resin formulation over the surface of the object to which the maskant coating is applied, and improve the smoothness and uniformity of the applied coating. A mixture of balanced or blended solvents of the above type have been found particularly useful for this purpose. An example of such a blended solvent is a mixture of methyl ethyl ketone, methyl isobutyl ketone and 2-nitropropane. The amount of such solvent or blended solvents employed can vary, the amount generally used being in the range of about 5% to about 40% by weight of the resin formulation.

When the resin formulation is to be used, a small amount of a photopolymerization catalyst or photoinitiator is added, sufficient to overcome the effect of any of the inhibitor, if used, and to promote the photopolymerization of the resin when the resin coating on the part is exposed to light of suitable wave length. For this purpose, any of the known free-radical producing catalysts for unsaturated compounds can be used with the polyester resins, including the organic peroxides. Illustrative of the latter, there may be included, for example, benzoyl peroxide, ditertiary butyl peroxide, dicumyl peroxide, and the like. These catalysts are often marketed in diluted paste form. For example, benzoyl peroxide is commercially available as a 50% paste in tricresyl phosphate. Organic peroxides of the above type function as catalysts for photopolymerization of unsaturated polyesters when exposed to actinic or ultra-violet light of suitable wave length, e.g. 3,000 to 4,000 A., by undergoing cleavage of the peroxide linkage to form highly active free radicals. Other types of free radical producing catalysts which can be used include, for example, acyloins such as benzoin, butyroin, and the like. Where acrylic resins are employed, polymerization catalysts such as biacetyl can be utilized. If desired, mixtures of these catalysts can also be employed. A minor amount of polymerization catalyst is employed, generally ranging from about 0.1% to about 5% by weight of the resin formulation.

I have found as another feature of the invention, that the incorporation of a fluorescent dye into the resin formulation has certain distinct advantages in the invention process. Such dye should be inert toward the other components of the resin formulation, including, for example, the polyester resin, the vinyl monomer, and the photopolymerization catalyst, and should be capable of activation in the composition, by light of suitable wave length. The fluorescent dye can function, following exposure and removal of the unexposed portions of the resin mask, e.g. in the developer bath described below, as an indicator to insure removal of all parts of the resin coating from such unexposed portions. Thus, following treatment of the part in the developer bath to remove such unexposed portions of the mask, the part can be irradiated with light of a wave length to activate such fluorescent dye, e.g. ultraviolet light, and if the unexposed portions of the mask have not been completely removed to form a clean bare surface in those surface areas of the part to be etched, fluorescent streaks will be emitted from any residual resin material still adhering to those bare surface areas of the part, indicating that further treatment in the developer bath is necessary. Also, the fluorescent dye serves to indicate the presence of pin holes in the exposed maskant portions, which if present, show up as dark spots under fluorescent light. Examples of such fluorescent dyes may include the substituted naphthalimide dyes, e.g. Calcofluor Yellow HEB, and the rhodamines, such as Rhodamine B, and the azosols such as Azosol 8–GF.

Another advantage of the use of a fluorescent dye in the resin formulations of the invention is that it serves as an indicator of certain of the various stages of treatment of the applied resin coating according to the process. Thus, generally the fluorescent indicator dye employed in one which emits a visible color such as yellow, in the visible spectrum, so that the applied coating has a uniform visible color such as yellow. However, the brightness of the coloration of the resin coating is different as among the stages (1) following application of the resin coating to the substrate and before exposure of the coating to actinic light, (2) following such exposure and prior to post drying, and (3) following post drying. If, for example, the coating employing an azosol yellow fluorescent dye is a bright yellow, this indicates that the coating is at the stage prior to exposure to actinic light, and if such coating is a dull yellow, this indicates that such coating has been exposed to actinic light. Still another shade of yellow coloration of the coating is observed after the thus exposed coating has been post dried.

I have also found as another feature of the invention that the degree of photopolymerization can be increased by addition of a material or materials, hereinafter referred to as accelerators, which function to enhance the rate of polymerization of the resin maskant when the latter is exposed to actinic light, e.g. ultra-violet light. Thus, the number of free radicals of the organic peroxide catalysts available to initiate polymerization can be directly influenced by the addition of accelerators. Accelerators function by speeding up the decomposition of the peroxide accelerator or initiator into free radicals, or by emitting at wave lengths producing photopolymerization of the resin even in the absence of photo-initiators such as the peroxides.

Accelerators can be chosen which absorb radiation within one wave length range and emit radiation within another wave length range which is the wave length region which activates the polymerization catalyst or photoinitiator for the polymerization process. Thus, for example, such accelerator may be one which absorbs radiation at wave lengths shorter than ultra-violet (e.g. X-rays) and emits radiation in the ultra-violet region to activate a catalyst or photoinitiator which absorbs in the ultra-violet. Also, an accelerator can be chosen which absorbs radiation in one part of the ultra-violet region, e.g. the far or short wave length ultra-violet region (2,000 to 3,000 A.) and emits in another part of the ultra-violet region, e.g. the near or long wave length ultra-violet (3,000 to 4,000 A.), which is the specific band of ultra-violet for greatest activation of the specific photoinitiator used.

The accelerator can function (a) to reduce the time for photopolymerization, (b) to reduce the amount of polymerization catalyst or photoinitiator, (c) to increase the degree of polymerization, or (d) to permit stepwise photopolymerization, e.g. to an initial "pre-gel" or "pre-polymer" using radiation of wave lengths activating the photoinitiator but not absorbed by the accelerator, followed by a full cure at wave lengths which activate the initiator and are absorbed by the accelerator.

When employing both an accelerator as above described and a polymerization catalyst or initiator, multiple radiation sources, e.g. two sources, can be used to increase photopolymerization, one which emits radiation in the region which activates the photoinitiator, and the other which emits radiation in a different region which is the region of absorption of the accelerator. The activation of the initiator may thus be intensified by activation energy emitted by the accelerator and by the additional activation energy emitted by the first of the two separate light sources noted above. Thus, for example, the polymer could be partially polymerized with a near ultraviolet light source only, which activates the initiator, followed by a full cure with both near and far ultraviolet light sources, the latter activating the accelerator. Also, partial cure could be accomplished with far ultraviolet light which is absorbed by the accelerator, which emits in the near ultraviolet to activate the initiator, followed by more complete polymerization using both near and far ultraviolet light sources.

Examples of accelerators which can be employed may include, for example, sodium bromide, aniline, dimethyl aniline, beta naphthylamine, anisol benzonitrile, naphthalene-beta sulfonic acid, ethyl-n-butyl carbonate, naphthalene, and resorcinol monobenzoate, and phosphors such as inorganic sulfides.

The heat sensitivity of the commonly used accelerators requires that the accelerators employed in the photopolymerization system of the invention be chosen to produce minimum polymerization at the temperatures at which the polymeric compositions applied to the substrate are subjected during initial drying and during light exposure of the composition to the activating light source. Some of the accelerators found to have low heat sensitivity in the unsaturated polyester composition described above include beta naphthylamine, sulfosalicyclic acid, N-chlorophthalimide and resorcinol monobenzoate, the latter material appearing most effective for this purpose.

Certain fluorescent substances or dyes may also function as accelerators, where such substances have a suitable absorption or activating wave range and a suitable emitting wave length range which includes a wave range that activates the catalyst or initiator, as described above, and which also produces a fluorescent emission within the visible spectrum. Thus, such fluorescent substance may function both as an indicator, following removal of the unexposed portions of the mask, to insure complete removal thereof as described above, and also as an accelerator to increase the rate of polymerization. Such a fluorescent substance may be, for example, anthracene or phenanthrene. However, it will be understood that if desired, a fluorescent substance or dye which functions only as an indicator, and a separate accelerator other than a fluorescent substance can be incorporated in the polymer formulation.

A minor amount of accelerator and/or fluorescent dye is incorporated into the polymer formulation, which can vary from about 0.1 to about 5% by weight of the resin formulation.

It has also been found that surface drying of the freshly applied resin coating on the part prior to exposure to light thereof, can be accomplished by addition of cobalt salts such as cobalt naphthenate to the resin formulation, employing small amounts thereof between about 0.1 and about 2%, usually less than 1%, by weight of the resin formulation.

It is particularly noteworthy that the resin formulations described above are photosensitive and have a sufficiently high rate of polymerization when exposed to actinic light to produce chemically resistant masks according to the invention, in the absence of light sensitive silver and gold salts.

In preparing the polyester or unsaturated polyester resin formulation for use, in preferred practice a mixture of polar blended solvents e.g. a mixture of methyl ethyl ketone, methyl isobutyl ketone and 2-nitropropane, is prepared, and to which may be added a fluorescent dye, e.g. a yellow azosol, as previously described. To this mixture there may be added preferably a plasticizer such as cellulose acetate-butyrate. The resulting mixture of solvated butyrate and dye is then preferably added to the liquid resin polyester formulation which may also contain a monomer, preferably diallyl phthalate, as previously noted. The catalyst, e.g. a peroxide, and also an additional accelerator, if employed, is added to the formulation just prior to use.

Where triallyl cyanurate monomer is added to the polyester resin, the resulting formulation, instead of being in liquid form, is usually in a solid condition.

It will be understood that the above is intended as exemplary of one mode of preparing a resin formulation for use according to the invention, and that other modes of preparing the resin formulation can be practiced.

Prior to application of the above described photopolymerizable maskant formulation to the substrate, usually a metal, preferably aluminum or steel, the metal is cleaned to insure proper adhesion of the maskant to the part surface. This can be accomplished, for example, in the case of aluminum parts, by contacting the parts first with an organic solvent to remove grease or similar surface materials, followed by treatment in a deoxidizer such as, for example, equeous solutions of hydrochloric and nitric acids, and which may include a small amount of hydrofluoric acid, to remove surface oxides and "smut." In the case of steel parts these may be treated in conventional pickling baths such as aqueous solutions of hydrochloric acid to remove surface contaminants.

A premeasured amount of the above described photopolymerizable polyester formulation preferably in liquid form and at ambient room temperature at say 70 to 80° F. is then poured onto the surface of the cleaned metal part, indicated at 10 in the accompanying drawing illustrating the invention, while the part is rotated at a speed such as to uniformly coat one side of the part of the panel with a predetermined thickness of the resin coating, at 12, ranging from about 2 to about 20 mils pre-gel thickness for the initially applied coating, to ultimately obtain a dry film thickness of the order of about 1 to 10 mils. However, it will be understood that the use of coatings having a dry film thickness outside the above range, e.g. as thin as about 0.1 mil, and as thick as about 30 mils are also contemplated within the purview of the invention. The use of cellulose acetate-butyrate and diallyl phthalate, above noted, in the preferred polyester resin formulations, increases surface wetting of the formulation and aids in obtaining reproducible, flat distortion-free wet films on the surface of the cleaned substrates. The incorporation of polar solvent, preferably a mixture of polar balanced solvents, into the resin formulation, as described above, not only aids in producing a smooth uniform film of applied resin on the part surface, but also permits small air bubbles which frequently form in the coating during the resin pouring operation to be broken or eliminated without difficulty.

Instead of pouring the resin formulation on the part while the latter is rotated, the formulation can be applied to the part by brush, spray or any other suitable technique. It has been found, however, that the part rotation technique is preferred since it results in smooth uniform coatings over the part surface in a short period of application.

The freshly coated panels or parts are then pre-dried at a temperature below that which will cause any significant amount of polymerization of the resin formulation, that is, under conditions such that the catalysts and accelerators present in the formulation remain essentially inactive. It has been found that such pre-drying can best be accomplished by irradiating the coating with infrared lamps located at a suitable distance from the coated panels, and for a suitable period of time such that any substantial amount of polymerization of the coating during this period is substantially avoided.

A template or negative indicated at 14 in the drawing, through which the coating is to be exposed, is then positioned at the desired location closely adjacent to or on the coating surface, and maintained in fixed location in any suitable manner. Where the pre-dried coating still retains some tackiness, the template can be positioned out of contact with, but closely adjacent to the coating, by employing suitable fastening means to hold the template fixed on the part in such position. Where the pre-dried coating is substantially non-tacky, the template can be placed in physical contact with the coated surface. Also, as further described herein, an alternative technique has been developed whereby the template can be placed in physical contact with even a relatively tacky coating on the part surface.

The masked part with the template or negative in position is then exposed to actinic light, usually a light source emitting a substantial amount of ultra-violet light, e.g. having a wave length range of about 3,000 A. to about 4,000 A. The use of a sunlamp for this purpose has been found most satisfactory. The part is placed a suitable distance from the light source, and the photopolymerizable coating is subjected to irradiation through the template or negative for a period sufficient to cause the exposed areas to be photopolymeribed to the proper degree. The areas of the maskant 12 thus exposed to actinic light through template 14 are indicated at A in the drawing, and the protected unexposed areas of the maskant 12 beneath the template are indicated at B in the drawing.

Following exposure of the coating to actinic light, the template 14 is removed from the part. The part is then immersed in a developer solution to remove the unexposed maskant portions B. Such a solution is preferably an organic solvent or mixture thereof, capable of loosening such unexposed maskant portions sufficiently to permit such portions to be washed away readily by a water spray. A particularly suitable solvent compositon for unsaturated polyester maskants of the above described types, has been found to be a mixture of cellosolve acetate, ethyl acetate and acetone. Air bubbled through the developing bath facilitates solvent attack against the unexposed areas of the maskant. Alternatively, the developer solution can be sprayed directly onto the part surface to flush away the unexposed portion of the maskant.

It has been found advantageous to incorporate into the developer solution a small amount of a dye, preferably a blue dye, as an indicator to insure complete removal of the unexposed portions B of the maskant by the jet water spray following treatment of the masked part in the developer. Thus, when the part is immersed in the developer, the dyed solution covers the unexposed portions of the maskant, and any residual portions of such unexposed portions which may remain after removal of portions B by the water spray are indicated by dyed smears on the surface of the metal. Treatment in the developer is continued until any such smears or streaks are removed.

If a fluorescent dye has been incorporated into the resin formulation, as in preferred practice, the above noted indicator dye can be omitted from the developer, since such fluorescent dye can function as an indicator to test for complete removal of the unexposed portions B of the maskant following treatment thereof in the developer solution. Thus, following such treatment and after removal of such unexposed portions by a water spray, the masked surface can be exposed to light of a wave length activating such fluorescent dye, e.g. ultra-violet light, and any undesirable residual portions of unexposed maskant will be revealed as fluorescent streaks, indicating further treatment of the maskant in the developer and/or water spray is necessary to obtain a clean metal surface suitable for subsequent chemical etching.

However, if desired, and in preferred practice, a fluorescent dye is incorporated into the resin formulation and also an indicator dye is used in the developer solution.

Following removal of the unexposed portion B of the maskant, as above described, the developed panel containing only the exposed photopolymerized maskant portions A is preferably rinsed with a solvent such as anhydrous ethyl alcohol for a short period to remove any residual surface dye and to rinse the exposed metal areas C adjacent the mask A.

The surface of the maskant A is then post dried to accomplish post curing which increases the chemical resistance of the mask, and to remove residual solvent. This is accomplished by the application of heat to the maskant. It has been found in practice that such post drying can be accomplished readily by irradiating the maskant surface with infrared lamps, positioned at a suitable distance from the mask, and for a predetermined time period sufficient to accomplish post curing.

The edges and back of the panel may then be masked, e.g. by lead tape, resistant to chemical etchants, and the panel containing on one surface thereof the photopolymerized maskant, with unprotected bare metal areas of desired configuration is now ready for chemical etching. Alternatively, and preferably, the back and edges of the part can also be coated initially with the resin formulations hereof, and the resulting coating precured prior to application of the maskant coating on the front surface of the panel, to form a mask protecting the back and edges of the part during subsequent etching.

The part is then treated or immersed in a chemical etching solution to attack said unprotected bare metal areas. If the metal part is aluminum, the part is generally treated with a hot aqueous solution containing an alkali such as potassium or sodium hydroxide, trisodium phosphate, soda ash or the like, preferably employing a sodium hydroxide solution, at temperatures generally ranging from about 100° F. to about boiling during treatment, using alkali concentrations generally ranging from about 0.1 to about 10 normal. If desired, a small amount of a sulfur-containing compound of the types disclosed in U.S. Patents 2,795,490 and 2,795,491, such as sodium sulfide, sodium hydrosulfide, or sodium polysulfide, can be incorporated into the alkali etchant to improve the quality of etch. By the term "aluminum as employed herein is meant substantially pure aluminum or any of its alloys.

The part is subjected to etching for a period sufficient to produce the desired depth of etch in the unexposed surface areas C of the part, to form an etch pattern D in the part 10, coresponding to the configuration of the template or negative through which the maskant was exposed to actinic radiation during photopolymerization.

The part preferably is then rinsed with a deoxidizer, particularly where the part is aluminum, to remove smut from the etched metal surface, such deoxidizer being, for example, an aqueous solution of hydrochloric or nitric acid, which may contain a small amount of hydrofluoric acid.

The etched part is then placed preferably in hot tap or distilled water, e.g. maintained at temperatures of about 125 to about 175° F., or alternatively in a solvent such as hot trichloroethylene vapor, to remove the maskant A. A particular advantage of the polyester type of maskant employed herein is that simply by immersion of the part in hot water, or in the above solvent, as above noted, the maskant can be peeled readily and relatively rapidly e.g. in ½ to about 1 minute, from the part, preferably while rinsing with hot water behind the film being peeled. The demasked part can then be immersed in a deoxidizer to remove any surface stains, followed by rinsing the part with water at ambient temperature.

The etch produced in the part employing the photopolymerization masking technique of the invention, particularly utilizing the polyester resins above described, has good line definition, and an etch factor at least comparable to those obtained employing conventional maskants, such as the neoprene type, for etch depths ranging from about .06" to about .25" in depth.

If the masked metal part is steel, any of the known etching solutions for steel can be employed, including aqueous solutions of hydrochloric, nitric, or hydrofluoric acid, or mixtures thereof, generally maintained at elevated temperatures ranging from about 130° to about 160° F.

If the masked part is copper, an etch solution such as an aqueous solution of ferric chloride can be employed.

Where the substrate is plastic, e.g. a thermoplastic material such as cellulose acetate, cellulose acetate-butyrate, acrylic resins and the like, a solvent is employed for etching or dissolving away the unexposed plastic surface portions of the substrate, such solvent being of a nature which substantially does not affect the polyester resin mask during the period of treatment. Thus, for example, in the case of cellulose acetate, a suitable solvent for this purpose may be, for example, methyl acetate, ethyl acetate or toluene.

The use of the resin formulations and photomasking procedure of the invention have the particular advantages of elimination of pin holes and craters in the maskant, increased film toughness and flexibility without loss of adhesion, freedom from distortion in the coating after exposure to the infrared light source and ultra-violet light source, removability of the unexposed portions of the maskant without removal of any of the adjacent actinic light exposed portions of the maskant, substantially improved line definition of the etched portion, and facility of final removal of the maskant following etching. Of particular note, the maskant is resistant to chemical etchants, including both alkali and acid solutions, and such solutions do not adversely affect the strippability characteristics of the maskant. It is particularly significant and surprising that the alkali and acid etching solutions do not bring about any loosening or removal of the maskant during the etching period, yet after such treatment, the photopolymerized maskant of the invention can be removed with water. Other advantages of the use of the photopolymerizable maskants and the maskant procedure of the invention include less sensitivity of the maskant to humidity, less complicated exposure, and less critical panel cleaning prior to application of the coating.

Certain of the unsaturated polyester resins of the invention, e.g. those derived from diethylene glycol, generally have a tendency to form soft relatively tacky films prior to photopolymerization. This can be allevated by application of a top seal coat over the relatively tacky surface of the freshly applied resin coating. Such top coat compositions can be polyvinyl alcohol, cellulose nitrate lacquer, ethyl cellulose, an acrylic resin, polyvinyl pyrollidone, and the like. Thus, for example, after application of such resin coating to the part surface, the coating can be vacuum dried for a short period, e.g. at oven temperatures of about 160 to about 190° F., and the part removed and immersed, e.g. in an aqueous solution of polyvinyl alcohol, or preferably a clear cellulose nitrate lacquer is applied. The polyvinyl alcohol or lacquer overcoating can then be air-dried until it is substantially tack free. The use of such a substantially non-tacky top coat has the advantage of permitting placement of a template in direct physical contact with such coating, whereas with resin coatings which have some tackiness, as previously noted, the template usually is displaced slightly away from the coating surface so as to prevent sticking of the template to the coating.

The top seal coat is of such composition and is sufficiently thin and transparent so that the photopolymerizable maskant coating below the top or seal coat can be exposed by actinic light through such top coat, to polymerize the exposed portions of the maskant coating, substantially without any adverse affects. After exposure and removal of the template from the part surface, such top coat can be removed in the developing bath containing an organic solvent, as described above, without interferring with removal of such unexposed maskant portions therein.

Although the chemical resistance of the above noted relatively soft polyester resin films, following photopolymerization, is somewhat inferior to the more desirable harder films, the degree of chemical resistance obtained from such polyester films is nevertheless adequate in many instances.

Placement of the template in direct physical contact with the coating is preferred since it results in the further advantage of a sharper more accurate exposure pattern after exposure of the coating to actinic light through the template, as compared to the pattern obtained when the template is positioned a slight distance from the coating, as is often done when the coating has some tackiness, as previously pointed out.

However, I have also found that where the applied resin coating is relatively tacky after pre-drying, a template can nevertheless be applied directly into physical contact with the tacky coating, and that the template can be removed from the coating readily without damage thereto following exposure of the coating to actinic light. Such template removal can be accomplished by treatment of the coating with a template still positioned thereon, in the above described developing solution containing organic solvents such as cellosolve acetate and ethyl acetate. Under these conditions, the developer solution functions to disengage the template from the coating, as well as to loosen and aid in removal of the unexposed portions of the resin coating. The limitation of this procedure is that the template must be placed precisely in position on the tacky surface and cannot be moved once it is in contact with the tacky surface; otherwise, the resin coating will be damaged.

I have further found that by applying a preformed thin transparent thermoplastic film or sheet over the tacky resin coating to present thereby a dry tack-free surface, a template can be positioned directly on such surface and the template can be moved and adjusted to place it in the precise position desired, without adhering to the resin maskant coating, and without the danger of thereby damaging such resin coating. Thus, after application of the polyester resin to the substrate, a thin sheet of thermoplastic material such as cellulose acetate or a vinyl resin can be stretched over the coating surface, the thermoplastic film adhering to the polyester coating. A template is then adjusted into position over the dry tack-free plastic film, while sliding the template over the film for this purpose. The resin coating is then exposed to actinic light through the template and through the exposed portions of the transparent plastic film to cause photopolymerization of the exposed portions of the maskant coating. The template is then removed, and the plastic film may then be stripped physically from the resin coating, followed by treatment of the coating in the above described developer solution to remove the unexposed portions of the resin coating, or such stripping can be avoided, and the plastic film removed, together with such unexposed portions of the resin coating, by treatment in such developer solution, where the organic solvent in said developer solution is a solvent for the plastic film. Thus, where the plastic film is cellulose acetate, this film may be removed in a developer solution which contains ethyl acetate.

In addition to use in chemical etching, the maskant compositions and procedure of the invention are useful in printed circuitry, lithography, photo engraving and insulating applications.

The following are examples of practice of the invention:

EXAMPLE 1

A resin formulation was prepared as described above, and having the following composition:

| | Percent by weight |
|---|---|
| *Resin A* | |
| Polyester resin prepared by heating 1 mol isophthalic acid, 1 mol maleic anhydride, and 2.1 mols of propylene glycol at 390 to 465° F. (acid number of 10 to 20) | 43.8 |
| *Resin B* | |
| Polyester resin prepared by heating 3 mols isophthalic acid, 4 mols fumaric acid and 7.18 mols of a mixture of diethylene and ethylene glycols (acid number of 10 to 20) | 1.2 |

| | Percent by weight |
|---|---|
| Styrene monomer | 30.0 |
| Diallyl phthalate monomer | 4.0 |
| Methyl ethyl ketone | 5.0 |
| Methyl isobutyl ketone | 5.0 |
| 2-nitropropane | 2.0 |
| Cellulose acetate-butyrate (½ second viscosity) | 5.0 |
| Azosol 8 GF (fluorescent yellow dye) | 0.1 |
| Mixture in the form of a 50% paste dispersion believed to comprise a mixture of a benzoin derivative and an organic peroxide including benzoyl peroxide, and marketed as U.V. 50 catalyst by U.S. Peroxygen Co. | 3.9 |
| | 100.0 |
| Total solids content | 54 |

The above maskant formulation at temperature of between 70 and 80° F. was poured onto 6" x 8" panels of cleaned 2024 aluminum rotated on a spinner at about 80 r.p.m. to obtain uniform coating of the resin over the entire panel surfaces, to a dry film thickness of about 8 to 12 mils.

The bright yellow maskant coating on the surface of the panels was then pre-dried under a series of four 250 watt infrared lamps for 10 minutes. The coloration of the coating at this stage and also prior to this predrying stage was a bright yellow.

A template was then placed on each of the panels and maintained in fixed position in the desired location on the panels, but spaced slightly from the coating surface, by means of suitable fasteners. The panels were then exposed through the design of the templates, to a 275 watt General Electric R.S. sunlamp producing ultra-violet light, for 20 minutes. Using a single sunlamp for each panel, the distance at which the lamp was placed from the coated surface was 12 inches.

Following exposure to the sunlamp, the template was removed from each of the panel surfaces. The bright yellow transparent color of the maskant in the areas protected from exposure by the template, was subdued to a yellow-gray hue in those areas of the coating exposed to the sunlamp, the unexposed area being sharply discernible from the light exposed areas.

The exposed panels were then immersed in a dye colored developer bath through which air was bubbled, such bath being comprised of the following:

| | Percent by weight |
|---|---|
| Cellosolve acetate | 80.0 |
| Ethyl acetate | 9.9 |
| Acetone | 9.9 |
| Brilliant Oil Blue BMA (blue dye) | 0.2 |
| | 100.0 |

The panels were each immersed in the above formulation for a period of 5 to 7 minutes. During this period the panels were removed from the bath at intervals of one minute and the coated surface flushed under a jet tap water spray, sloughing off the unexposed areas of the maskant until the base metal surface was revealed. The presence of residual pieces of maskant in the unexposed areas was evident by streaks of blue dye picked up in such areas from the developer solution. The developed panels were then immersed in anhydrous ethyl alcohol for 30 seconds to remove surface dye stains and to rinse exposed metal areas. The maskant coatings were then post dried for 30 to 45 minutes under 250 watt infrared lamps positioned at a distance of 8 inches from the coated surfaces. The edges of the maskant adjacent the bare metal surfaces were sharply defined.

The back and edges of each of the panels were then masked with lead foil tape, and the panels were then immersed in an aqueous alkaline chemical etchant bath containing caustic soda, and maintained at a temperature of about 185 to 195° F., for a period of about 2 hours.

In preferred practice the back and edges of the panels are precoated with the resin composition of the invention described above, and such resin composition prepolymerized, after which the resin composition is applied to the front surface of the panels to be etched, to form the maskant coating according to the invention.

Following treatment in the etching bath the panels were immersed in an aqueous deoxidizer solution containing a major proportion of sodium bisulfate, and minor proportions of a bichromate and a fluoride, and were water rinsed and air dried. The panels were then placed in hot tap water for about 1 minute, and the maskant was then peeled from the panels, preferably running hot water behind the film during this peeling or stripping operation. Then the demasked panels were again immersed in a deoxidizer solution of the composition noted above, and rinsed in tap water at room temperature.

The etched pattern in each of the panels was sharply defined with good reproduction of the template design. The etch factors both with and against the grain ranged from about 1.0 to about 1.10 for the panels.

The term "etch factor" as employed herein is the distance or amount of lateral undercutting between the edge of the mask and the wall of the etched portion of the part, divided by the vertical depth of etch of the part. It is desirable to obtain an etch factor of approximately 1.

Where the back and edges of the panels are alternatively coated with the resin formulation described above, to protect such edges and back of the panels during etching, such coatings are removed together with the maskant coating on the front of the panels, during treatment of the panels with hot water, as described above.

EXAMPLE 2

The procedure of Example 1 was substantially repeated, but employing cold rolled steel panels in place of aluminum panels as the substrate, and using as the etchant an aqueous acid solution containing mainly a mixture of hydrochloric and nitric acids. The solution was maintained at about 150° F. during the etching period.

Results similar to those of Example 1 were obtained.

EXAMPLE 3

The procedure of Example 1 is repeated, but omitting the blue dye from the developer solution. Following treatment of the panels in the developer solution, the coatings are irradiated with ultraviolet light. Any green fluorescent smears in the unexposed areas from which the unexposed maskant is removed, indicates the presence of residual portions of maskant, which are removed by further treatment of the coatings in the developer solution. The fluorescent smears are produced by the Azosol dye initially present in the coating formulation. Also, any dark spots in the exposed portion of the coating from which is emitted a uniform, green fluorescence would indicate the undesirable presence of pinholes in such coating. No such dark spots were observed, indicating a good maskant coating was formed, with no pinholes.

Results similar to those of Example 1 are otherwise obtainable.

EXAMPLE 4

A resin formulation was prepared as described above, having the following composition:

| | Percent by weight |
|---|---|
| Resin A | 43.8 |
| Resin B | 1.2 |
| Styrene monomer | 30.1 |
| Diallyl phthalate monomer | 4.0 |
| Methyl ethyl ketone | 5.2 |
| Methyl isobutyl ketone | 5.2 |
| 2-nitropropane | 2.0 |
| Cellulose acetate-butyrate (½ second viscosity) | 5.0 |
| Azosol-8 GF | 0.1 |
| Resorcinol monobenzoate | 0.15 |
| U.V. 50 catalyst mixture | 3.3 |
| | 100.0 |
| Total solid content | 53.4 |

The procedure of Example 1 was substantially repeated, except for the following variations.

The dry film thickness of the maskant coating applied to the 2024 aluminum panels was about 6 mils.

Following removal of the panels from the developer bath, the remaining maskant coatings were post dried for only 20 minutes by the infrared lamps, and then were post cured in an oven at about 150° F. for 15 minutes.

Following etching in the alkaline chemical etching solution described in Example 1, the etched aluminum panels had sharp line definition, and an etch factor with the grain of 1.05 and an etch factor across the grain of 1.16.

EXAMPLE 5

The procedure of Example 1 is substantially repeated, except that 30% of trialkyl cyanurate monomer is incorporated into the composition in place of the 30% of styrene monomer.

Results similar to those of Example 1 are obtained except that this formulation containing triallyl cyanurate has the advantage of producing a less tacky film after the pre-drying stage and prior to exposure to the sunlamp.

EXAMPLE 6

The procedure of Example 1 is substantially repeated, except that 30% of trialkyl cyanurate monomer is instrate in place of the aluminum panels.

The removal of the unexposed portions of the maskant and the etching operation are carried out simultaneously by treatment of the masked plastic plates in the developer solution described in Example 1, which loosens and removes the unexposed maskant portions and also dissolves the cellulose acetate in the resulting bare surface areas, but does not affect the mask covering the protected portions of the plastic surface.

An etch pattern is provided having sharp line definition along the peripheral walls of the etch.

EXAMPLE 7

The procedure of Example 1 is repeated except employing copper plates instead of the aluminum panels of Example 1. The masked copper plates are etched in a 43% aqueous ferric chloride solution, producing, after removal of the mask as described in Example 1, a sharply defined etch pattern.

EXAMPLE 8

The procedure of Example 1 is repeated except that 45% of Resin A and none of Resin B is employed, and the isophthalic acid of Resin A is replaced by an additional mol of maleic anhydride, thus providing a polyester resin by reacting 2 mols of maleic anhydride to 2.1 mols of propylene glycol.

Results similar to those of Example 1 are obtainable.

EXAMPLE 9

The procedure of Example 1 is repeated except for the following variations.

After application of the resin formulation to the surface of the aluminum panels, a thin transparent film of cellulose nitrate lacquer is applied over the polyester coating. The lacquer coating is air-dried, to form a top surface coating of reduced tackiness, and the template positioned thereover. Such lacquer coating is removed, together with the unexposed portions of the maskant coating, in the developer bath.

EXAMPLE 10

The procedure of Example 1 is repeated, except that the template is positioned in direct contact with the resin coating on each of the panels. Following exposure to the sunlamp, the panels with the templates still adhering to their surfaces, are immersed in the dye developer of Example 1, which causes the templates to disengage from contact with the unexposed portions of the resin coatings, after which such unexposed portions come into direct contact with the developer solution to cause loosening of such unexposed coating areas and removal thereof by the jet water spray as described in Example 1.

EXAMPLE 11

The procedure of Example 1 is repeated except that after pre-drying of the freshly applied maskant coating, a preformed thin transparent sheet of cellulose acetate is applied over and into contact with the resin coating. The template is then positioned on the top surface of the acetate film and adjusted in the desired position.

Following exposure of the resin coating to actinic light through the template and the plastic film, and removal of the template, the panels are then treated in the colored developer, as described in Example 1, removing first the cellulose acetate film and then the unexposed portions of the resin coating.

Results similar to those of Example 1 are obtainable.

EXAMPLE 12

The procedure of Example 1 is repeated, except that in place of Resin A and Resin B, 60% by weight of a resin is used, said resin prepared by reacting 1 mol of maleic anhydride and 0.25 mol adipic acid, for each 1.37 mols of propylene glycol, and employing 15% by weight of styrene monomer, the other components of the resin composition and the amounts thereof being the same as in Example 1.

Results similar to those of Example 1 are obtainable.

From the foregoing, it is seen that the invention provides novel thermosetting photopolymerizable resin formulations, particularly unsaturated polyester resin formulations, and novel procedure for providing photopolymerized masks on a substrate including, for example, metals and plastics, and useful in a wide variety of applications, having the advantages, among others heretofore listed, of affording an initial pre-dried coating in many instances having reduced surface tack, and undergoing a minimum amount of premature polymerization; providing rapid polymerization of the resin on exposure thereof to actinic, e.g. ultra-violet, light; permitting facile removal of the unexposed maskant portions in a developer bath without removing exposed maskant portions; permitting ease of stripping of the mask by simple means such as hot water after etching; and resulting in an etch pattern having sharp line definition.

While I have described particular embodiments of my invention for purposes of illustration, it should be understood that various modifications and adaptations thereof may be made within the spirit of the invention, as set forth in the appended claims.

I claim:

1. A photosensitive resin formulation free of light sensitive silver and gold salts and suitable for production of a maskant which is resistant to chemical etchants, which comprises (1) about 5% to about 80% by weight of said formulation of a resinous polyester formed by esterifying a compound chosen from the group consisting of ethylenically unsaturated polycarboxylic acids and the anhydrides of said acids, with a glycol, (2) about 5% to about 40% by weight of said formulation of an organic polar solvent for said resin, capable of forming a smooth, uniform coating of said formulation, (3) about 10% to about 150% by weight of said resin of a vinyl monomer, (4) about 0.1% to about 5% by weight of said formulation of a fluorescent dye inert to any of the above-mentioned components, and capable of activation in said formulation by light having a suitable activating wave length, and (5) about 0.1% to about 5% by weight of said formulation of a photopolymerization catalyst.

2. A photosensitive resin formulation free of light sensitive silver and gold salts and suitable for production of a maskant which is resistant to chemical etchants, which comprises (1) about 25% to about 60% by weight of said formulation of a resinous polyester formed by esterifying a mixture of a compound chosen from the group consisting of ethylenically unsaturated polycarboxylic acids and the anhydrides of said acids, and a compound chosen from the group consisting of aromatic dicarboxylic acids and their anhydrides, with a glycol, (2) about 5% to about 40% by weight of said formulation of an organic polar solvent for said resin, capable of forming a smooth, uniform coating of said formulation, (3) about 10% to about 150% by weight of said resin of a vinyl monomer, (4) about 0.1% to about 5% by weight of said formulation of a fluorescent dye inert to any of the above-mentioned components, and capable of activation in said formulation by light having a suitable activating wave length, and (5) about 0.1% to about 5% by weight of said formulation of a photopolymerization catalyst.

3. A photosensitive resin formulation free of light sensitive silver and gold salts and suitable for production of a maskant which is resistant to chemical etchants, which comprises (1) about 25% to about 60% by weight of said formulation of a resinous polyester formed by esterifying a mixture of a compound chosen from the group consisting of ethylenically unsaturated polycarboxylic acids and the anhydrides of said acids, and a compound chosen from the group consisting of aromatic dicarboxylic acids and their anhydrides, with a glycol, (2) about 5% to about 40% by weight of said formulation of an organic polar solvent for said resin, capable of forming a smooth, uniform coating of said formulation, (3) about 10% to about 150% by weight of said resin of a vinyl monomer, (4) about 0.1% to about 5% by weight of said formulation of a fluorescent dye inert to any of the above-mentioned components, and capable of activation in said formulation by light having a suitable activating wave length, and (5) about 0.1% to about 5% by weight of said formulation of a free radical producing photopolymerization catalyst.

4. A photosensitive resin formulation free of light sensitive silver and gold salts and suitable for production of a maskant which is resistant to chemical etchants, which comprises (1) about 25% to about 60% by weight of said formulation of a resinous polyester formed by esterifying a compound chosen from the group consisting of ethylenically unsaturated polycarboxylic acids and the anhydrides of said acids, with a glycol, (2) about 5% to about 40% by weight of said formulation of an organic polar solvent for said resin, capable of forming a smooth, uniform coating of said formulation, (3) about 10% to about 150% by weight of said resin of a vinyl monomer, (4) about 0.1% to about 5% by weight of said formulation of a free radical producing photopolymerization catalyst, (5) about 0.1% to about 5% by weight of said formulation of an accelerator capable of increasing the degree of photopolymerization of said resin formulation on exposure thereof to actinic light, and (6) about 0.1% to about 5% by weight of said formulation of a fluorescent dye inert to any of the above-mentioned components, and capable of activation in said formulation by light having a suitable activating wave length.

5. A photosensitive resin formulation as defined in claim 1, wherein said resinous polyester is formed by esterifying isophthalic acid and a member of the group consisting of maleic acid, maleic anhydride and fumaric acid, with a glycol.

6. A photosensitive resin formulation as defined in claim 1, said vinyl monomer including styrene.

7. A photosensitive resin formulation as defined in claim 1, said vinyl monomer including styrene and diallyl phthalate.

8. A photosensitive resin formulation as defined in claim 1, and including about 2% to about 6% by weight of said formulation of cellulose acetate-butyrate.

9. A photosensitive resin formulation free of light sensitive silver and gold salts and suitable for production of a maskant which is resistant to chemical etchants, which comprises (1) about 25% to about 60% by weight of said formulation of a resinous polyester formed by esterifying 1 mol isophthalic acid and 1 mol maleic anhydride, with about 2 mols of propylene glycol, (2) about 5% to about 40% by weight of said formulation of a ketone as solvent for said resin, (3) about 10% to about 150% by weight of said resin of a vinyl monomer including styrene and diallyl phthalate, (4) about 0.1% to about 5% by weight of said formulation of an organic peroxide effective as a photopolymerization catalyst, (5) about 0.1% to about 5% by weight of said formulation of an azosol fluorescent dye inert to any of the above-mentioned components, and capable of activation in said formulation by light having a suitable activating wave length, and (6) about 2% to about 6% by weight of said formulation of cellulose-acetate-butyrate.

10. A photosensivtive resin formulation as defined in claim 9, said solvent for said resin being a mixture of methyl ethyl ketone, methyl isobutyl ketone, and 2-nitropropane.

11. An article comprising a substrate selected from the group consisting of metals and plastics, having a coating thereon comprising a photosensitive resin formulation, as defined in claim 1.

12. The process which comprises applying to a surface of a substrate a photosensitive resin formulation which comprises (1) a substantial proportion of a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, (2) an organic polar solvent for said resin, capable of forming a smooth, uniform coating of said formulation, (3) a vinyl monomer, and (4) a minor proportion of a photopolymerization catalyst, subjecting said applied coating to infra-red radiation under conditions to dry said coating without causing any substantial polymerization of said coating, irradiating preselected portions of said coating with ultraviolet actinic light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, subjecting said mask to infra-red radiation under conditions to produce further polymerization of said mask to increase its chemical resistance, subjecting said masked substrate to a chemical etching solution and etching the exposed unmasked portions of the surface of said substrate to a predetermined depth, substantially without affecting said mask, and treating said mask with a substance capable of at least loosening said mask, and removing said mask from the surface of said substrate.

13. The process which comprises applying to a surface of a substrate selected from the group consisting of metals and plastics, a photosensitive resin formulation as defined in claim 1, drying said coating without causing any substantial polymerization of said coating, irradiating preselected portions of said coating with actinic light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, subjecting said mask to heat to produce further polymerization of said mask to increase its chemical resistance, subjecting said masked substrate to a chemical etching solution and etching the exposed unmasked portions of the surface of said substrate to a predetermined depth, substantially without affecting said mask, and treating said mask with hot water, and removing said mask from the surface of said substrate.

14. The process which comprises applying to a surface of a substrate selected from the group consisting of metals and plastics, a photosensitive resin formulation, as defined in claim 9, subjecting said applied coating to infrared radiation under conditions to dry said coating without causing any substantial polymerization of said coating, irradiating preselected portions of said coating with actinic ultraviolet light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, subjecting said mask to infrared radiation under conditions to produce further polymerization of said mask to increase it chemical resistance, subjecting said masked substrate to a chemical etching solution and etching the exposed unmasked portions of the surface of said substrate to a predetermined depth, substantially without affecting said mask, and treating said mask with hot water, and removing said mask from the surface of said substrate.

15. In a process as defined in claim 14, said organic solvent for loosening the unexposed portions of said coating comprising a substantial proportion of Cellosolve acetate, and minor proportions of ethyl acetate and acetone, and a small amount of an indicator dye capable of coloring any residual unexposed portions of said coating to detect same.

16. The process which comprises applying to a surface of a substrate a photosensitive resin formulation which comprises (1) a substantial proportion of a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, (2) an organic polar solvent for said resin, capable of forming a smooth, uniform coating of said formulation, (3) a vinyl monomer, (4) a minor proportion of a photopolymerization catalyst, and (5) a minor proportion of a fluorescent dye inert to any of the above-mentioned components, and capable of activation in said formulation, by light having a suitable activating wave length, drying said coating without causing any substantial polymerization of said coating, irradiating preselected portions of said coating with actinic light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, subjecting the surface of said substrate to light having a wave length to activate said fluorescent dye, to give a fluorescent indication of the presence of any residual unexposed portions of said coating in said unexposed coating areas, subjecting said mask to further polymerization to increase its chemical resistance, subjecting said masked substrate to a chemical etching solution and etching the exposed unmasked portions of the surface of said substrate to a predetermined depth, substantially without affecting said mask, and treating said mask with a substance capable of at least loosening said mask, and removing said mask from the surface of said substrate.

17. The process which comprises applying to a surface of a substrate selected from the group consisting of metals and plastics, a photosensitive resin formulation which comprises (1) a substantial proportion of a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, (2) an organic polar solvent for said resin, capable of forming a smooth, uniform coating of said formulation, (3) a vinyl monomer, and (4) a minor proportion of a photopolymerization catalyst, subjecting said applied coating to a source of infrared radiation so as to dry said coating without causing any substantial polymerization of said coating, irradiating preselected portions of said coating with a source of ultra-violet actinic light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, said solvent solution containing a minor amount of an indicator dye capable of indicating the presence of any residual unexposed portions of said coating following treatment of said coating with said organic solvent, subjecting said masked substrate to a chemical etching solution, and etching the exposed unmasked portions of the surface of said substrate to a predetermined depth, treating said mask with hot water to loosen said mask, and removing said mask from the surface of said substrate.

18. The process which comprises applying to a surface of a substrate a photosensitive resin formulation which comprises (1) a substantial proportion of (a) a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, and (b) polyacrylate resins, (2) an organic polar solvent for said resin, capable of forming a smooth, uniform coating of said formulation, (3) a vinyl monomer, and (4) a minor proportion of a photopolymerization catalyst, drying said coating without causing any substantial polymerization of said coating, irradiating preselected portions of said coating with actinic light while protecting other portions of said coating from exposure to said actinic light, to produce photopolymerization of said preselected portions of said coating, treating the resulting coating with an organic solvent capable of loosening the portions of said coating unexposed to said actinic light, removing said unexposed portions of said coating, subjecting said masked substrate to a chemical etching solution and etching the exposed unmasked portions of the surface of said substrate to a predetermined depth, substantially without affecting said mask, and treating said mask with a substance capable of at least loosening said mask, and removing said mask from the surface of said substrate.

19. The process as defined in claim 18, wherein said substrate is aluminum, and said chemical etching solution comprises an aqueous alkali solution.

20. The process as defined in claim 18, wherein said substrate is steel, and said chemical etching solution is an aqueous acid solution.

21. The process which comprises applying a liquid photosensitive resin formulation on a surface of a part constructed of a member selected from the group consisting of metals and plastics, said formulation comprising (1) a substantial proportion of (a) a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, and (b) polyacrylate resins, (2) an organic polar solvent for said resin, capable of forming a smooth, uniform coating of said formulation, (3) a vinyl monomer, and (4) a minor proportion of a photopolymerization catalyst, drying said coating without causing any substantial polymerization of said coating, positioning a template over the coated surface of said part, irradiating said coated surface through said template with a source of actinic light to produce photopolymerization of the exposed portions of said coating, removing said template, and treating the resulting coating in an organic solvent solution to loosen the unexposed portions of said coating, removing the unexposed portions of said coating, leaving a mask on said part surface, subjecting said mask to a source of heat to post cure said mask, subjecting said masked substrate to a chemical etching solution and etching the exposed unmasked portions of the surface of said substrate to a predetermined depth, substantially without affecting said mask, and treating said mask with a substance capable of at least loosening said mask, and removing said mask from the surface of said substrate.

22. The process for applying a mask to a part constructed of a member selected from the group consisting of metals and plastics, and etching said part in the unprotected surface areas thereof adjacent said mask, which comprises pouring a liquid photosensitive resin formulation, as defined in claim 1, on a surface of said part while said part is rotated, to obtain a uniform flow of said formulation over said surface, irradiating the resin coating on said surface with a source of infrared radiation so as to dry said coating without causing any substantial polymerization of said coating, positioning a template over the coated surface of said part, irradiating said coated surface through said template with a source of ultra-violet actinic light to produce photopolymerization of the exposed portions of said coating, removing said template, immersing the resulting coating in an organic solvent solution comprising a member selected from the group consisting of Cellosolve acetate, ethyl acetate and acetone, to loosen the unexposed portions of said coating, removing the unexposed portions of said coating, said solvent solution containing a minor amount of an indicator dye capable of indicating the presence of any residual unexposed portions of said coating following treatment of said coating with said organic solvent, leaving a mask on said part surface, subjecting said mask to a source of infrared radiation to post cure said mask, subjecting said masked part to a chemical etching solution and etching the exposed unmasked portions of the surface of said part to a predetermined depth, treating said mask with hot water to loosen said mask, and removing said mask from the surface of said part.

23. The process which comprises applying a liquid photosensitive resin formulation on a surface of a part constructed of a member selected from the group consisting of metals and plastics, said formulation comprising (1) a substantial proportion of (a) a resinous polyester formed by esterifying a compound chosen from the group consisting of ethylenically unsaturated polycarboxylic acids and the anhydrides of said acids, with a member selected from the group consisting of polyhydroxy aromatic and polyhydroxy aliphatic compounds, and (b) polyacrylate resins, (2) an organic polar solvent for said resin, capable of forming a smooth, uniform coating of said formulation, (3) a vinyl monomer, and (4) a minor proportion of a photopolymerization catalyst, forming a tacky coating, applying a thin preformed thermoplastic transparent sheet over said tacky coating, positioning a template over said sheet, irradiating said coated surface through said template and said sheet with a source of actinic light to produce photopolymerization of the exposed portions of said coating, removing said template, immersing the resulting coating in an organic solvent solution to disengage said sheet and to loosen the unexposed portions of said coating, removing the unexposed portions of said coating, leaving a mask on said part surface, subjecting said mask to a source of heat to post cure said mask, subjecting said masked substrate to a chemical etching solution and etching the exposed unmasked portions of the surface of said substrate to a predetermined depth, substantially without affecting said mask, and treating said mask with a substance capable of at least loosening said mask, and removing said mask from the surface of said substrate.

24. The process for applying a mask to a part constructed of a member selected from the group consisting of metals and plastics, and etching said part in the unprotected surface areas thereof adjacent said mask, which comprises pouring a liquid photosensitive resin formulation, as defined in claim 1, on a surface of said part while said part is rotated, to obtain a uniform flow of said formulation over said surface, forming a tacky coating, applying a thin preformed thermoplastic transparent sheet over said tacky coating, positioning a template over said sheet, irradiating said coated surface through said template and said sheet with a source of ultra-violet actinic light to produce photopolymerization of the exposed portions of said coating, removing said template, immersing the resulting coating in an organic solvent solution, to disengage said sheet and to loosen the unexposed portions of said coating, removing the unexposed portions of said coating, leaving a mask on said part surface, subjecting said mask to a source of infrared radiation to post cure said mask and form a chemically resistant mask, subjecting said masked part to a chemical etching solution and etching the exposed unmasked portions of the surface of said part to a predetermined depth, treating said mask with hot water to loosen said mask, and removing said mask from the surface of said part.

25. A photosensitive resin formulation free of light sensitive silver and gold salts and suitable for production of a maskant which is resistant to chemical etchants, which comprises (1) about 25% to about 60% by weight of said formulation of a resinous polyester formed by esterifying a compound chosen from the group consisting of ethylenically unsaturated polycarboxylic acids and the anhydrides of said acids, with a glycol, (2) about 5% to about 40% by weight of said formulation of an organic polar solvent for said resin, capable of forming a smooth, uniform coating of said formulation, (3)

about 10% to about 150% by weight of said resin of a vinyl monomer, (4) about 0.1% to about 5% by weight of said formulation of a free radical producing photopolymerization catalyst, and (5) about 0.1% to about 5% by weight of said formulation of an accelerator capable of increasing the degree of photopolymerization of said resin formulation on exposure thereof to actinic light, said accelerator being a fluorescent substance having a fluorescent emission within the visible spectrum.

References Cited by the Examiner

UNITED STATES PATENTS

| | | | |
|---|---|---|---|
| 1,587,274 | 6/1926 | Beebe et al. | 96—115 |
| 2,305,224 | 12/1942 | Patterson | 96—115 |
| 2,620,282 | 12/1952 | Fry et al. | 252—301.2 |
| 2,650,309 | 4/1953 | Webb et al. | 252—301.3 |
| 2,773,869 | 12/1956 | Leavitt | 252—301.2 |
| 2,791,504 | 5/1957 | Plambeck | 96—115 |
| 2,875,047 | 2/1959 | Oster | 96—115 |
| 2,895,917 | 7/1959 | Gaunt | 252—301.2 |
| 2,927,023 | 3/1960 | Martin | 96—115 |
| 2,929,931 | 3/1960 | Rechter et al. | 252—301.2 |
| 2,948,611 | 8/1960 | Barney | 96—115 |
| 2,949,361 | 8/1960 | Agens | 96—115 |
| 2,985,593 | 5/1961 | Broderick et al. | 252—301.2 |
| 3,031,301 | 4/1962 | Agens | 96—115 |
| 3,047,422 | 7/1962 | Sites et al. | 96—115 |
| 3,060,025 | 10/1962 | Burg et al. | 96—115 |

NORMAN G. TORCHIN, *Primary Examiner.*

T. J. HOFFMAN, R. H. SMITH, *Assistant Examiners.*